(12) United States Patent
Then et al.

(10) Patent No.: US 10,553,689 B2
(45) Date of Patent: Feb. 4, 2020

(54) MULTIPLE STACKED FIELD-PLATED GAN TRANSISTOR AND INTERLAYER DIELECTRICS TO IMPROVE BREAKDOWN VOLTAGE AND REDUCE PARASITIC CAPACITANCES

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US); Sanaz K. Gardner, Hillsboro, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/777,140

(22) PCT Filed: Dec. 23, 2015

(86) PCT No.: PCT/US2015/000317
§ 371 (c)(1),
(2) Date: May 17, 2018

(87) PCT Pub. No.: WO2017/111795
PCT Pub. Date: Jun. 29, 2017

(65) Prior Publication Data
US 2018/0331191 A1   Nov. 15, 2018

(51) Int. Cl.
*H01L 29/40* (2006.01)
*H01L 29/66* (2006.01)
(Continued)

(52) U.S. Cl.
CPC .......... *H01L 29/404* (2013.01); *H01L 21/765* (2013.01); *H01L 29/2003* (2013.01); *H01L 29/66462* (2013.01); *H01L 29/78* (2013.01)

(58) Field of Classification Search
CPC .............. H01L 29/404; H01L 29/2003; H01L 29/66462; H01L 29/78; H01L 29/66522; H01L 29/7786
See application file for complete search history.

(56) References Cited

U.S. PATENT DOCUMENTS 9,306,014 B1 * 4/2016 Kudymov ............. H01L 29/404
2007/0235761 A1   10/2007 Parikh et al.
(Continued)

OTHER PUBLICATIONS

International Search Report and Written Opinion for International Patent Application No. PCT/US2015/000317 dated Sep. 22, 2016, 13 pgs.
(Continued)

*Primary Examiner* — Julia Slutsker
(74) *Attorney, Agent, or Firm* — Schwabe, Williamson & Wyatt, P.C.

(57) ABSTRACT

Embodiments of the invention include a high voltage transistor with one or more field plates and methods of forming such transistors. According to an embodiment, the transistor may include a source region, a drain region, and a gate electrode formed over a channel region formed between the source region and drain region. Embodiments of the invention may also include a first interlayer dielectric (ILD) formed over the channel region and a second ILD formed over the first ILD. According to an embodiment, a first field plate may be formed in the second ILD. In an embodiment the first field plate is not formed as a single bulk conductive feature with the gate electrode. In some embodiments, the first field plate may be electrically coupled to the gate
(Continued)

electrode by one or more vias. In alternative embodiments, the first field plate may be electrically isolated from the gate electrode.

25 Claims, 7 Drawing Sheets

(51) Int. Cl.
*H01L 29/78* (2006.01)
*H01L 29/20* (2006.01)
*H01L 21/765* (2006.01)

(56) References Cited

U.S. PATENT DOCUMENTS

| | | | |
|---|---|---|---|
| 2008/0272443 A1* | 11/2008 | Hoshi | H01L 29/2003 257/409 |
| 2009/0261384 A1* | 10/2009 | Yang | H01L 29/404 257/194 |
| 2011/0221011 A1 | 9/2011 | Bahat-Treidel et al. | |
| 2014/0035044 A1 | 2/2014 | Ahn et al. | |

OTHER PUBLICATIONS

International Preliminary Report on Patentability for PCT Patent Application No. PCT/US2015/000317 dated Jul. 5, 2018, 10 pgs.

\* cited by examiner

MULTIPLE STACKED FIELD-PLATED GAN TRANSISTOR AND INTERLAYER DIELECTRICS TO IMPROVE BREAKDOWN VOLTAGE AND REDUCE PARASITIC CAPACITANCES

CROSS-REFERENCE TO RELATED APPLICATION

This patent application is a U.S. National Phase Application under 35 U.S.C. § 371 of International Application No. PCT/US2015/000317, filed Dec. 23, 2015, entitled "MULTIPLE STACKED FIELD-PLATED GAN TRANSISTOR AND INTERLAYER DIELECTRICS TO IMPROVE BREAKDOWN VOLTAGE AND REDUCE PARASITIC CAPACITANCES," which designates the United States of America, the entire disclosure of which is hereby incorporated by reference in its entirety and for all purposes.

FIELD OF THE INVENTION

Embodiments of the invention are in the field of semiconductor devices and processing and, in particular, formation of a gallium-nitride transistor with one or more field plates, and methods of forming such devices.

BACKGROUND OF THE INVENTION

Due to its wide bandgap and high critical breakdown electric field, gallium nitride (GaN) transistors are great candidates for high voltage applications. High voltage applications may include power converters, (radio-frequency) RF power amplifiers, RF switches and other high voltage applications. However, simple transistor architecture, namely, having a single gate, source and drain, is not able to take advantage of these electrical properties. Such GaN transistors fall short of realizing the maximum breakdown voltage dictated by the material properties of GaN because drain electric field lines concentrate at the edge of the gate and causes premature breakdown. The concentration of electric field lines is the result of complex interactions in the device and is typically experienced by most transistors regardless of material used for the channel. However, the electric field line concentration is particularly problematic in GaN transistors due to the high voltages.

DETAILED DESCRIPTION OF THE INVENTION

Described herein are systems that include a semiconductor device and methods for forming the semiconductor device that includes field plates formed above the gate electrode. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
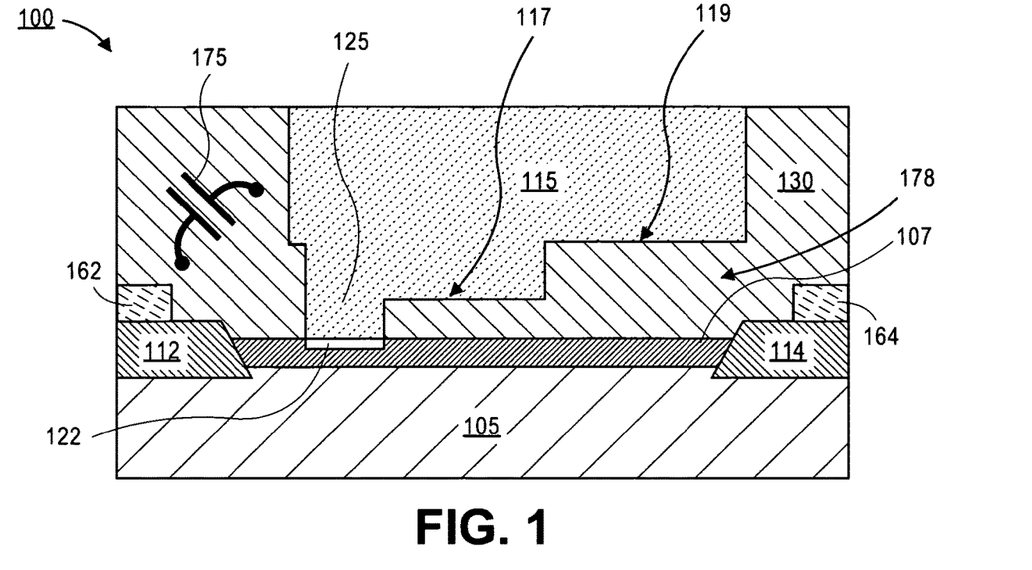
FIG. 1 is a cross-sectional illustration of a transistor that includes a bulk field plate coupled to the gate electrode in a bulk conductive structure.

One solution to reduce electric field line concentration at the edge of the gate is to use a field plate to provide a plane of low potential that redistributes the electric field lines towards the field plate instead of toward the edge of the gate electrode. FIG. 1 provides a cross-sectional illustration of a transistor 100 that includes a typical field plate that may be used. The illustrated transistor 100 includes a channel 105, source 112, and drain 114. In some transistors a polarization layer 107 may also be formed over the top surface of the channel 105. The gate electrode 125 is separated from the polarization layer and the channel 105 by a gate dielectric 122. In order to control the distribution of electric field between the 214 and the gate electrode, one or more field plate surfaces 117 and 119 may be formed above the channel 105. The use of field plate surfaces 117 and 119 enhance the breakdown voltage of the transistor.

However, currently available devices with field plates have several drawbacks. First, the field plates 117 and 119 are formed as a single bulk conductive feature 115. As such, each field plate surface 117/119 is coupled to each other and the gate electrode, as shown in FIG. 1. Additionally, the bulk structure typically continues across all cross-sections (i.e., into and out of the page). This significantly increases the volume of metal proximate to the channel and introduces significant amounts of parasitic capacitance 175 into the device. As such, the maximum operating frequency of the transistor 100 is reduced. Additionally, the formation of multiple plates 117/119 requires dedicated masks and processing operations that increase the cost of the device. Furthermore, the material choice for the dielectric fill 130 is limited because the material needs to be able to fill cavities 178 underneath the plates. As such, materials that need to be deposited with sputtering or chemical vapor deposition (CVD) are not able to be used.

Embodiments of the invention provide a GaN transistor with field plates and a method to form the field plates without needing dedicated processing operations. Embodiments of the invention allow for the field plates to be formed in the ILD layers of the back end of line (BEOL) stack that are used to form the interconnect lines. As such, the multiple different ILD materials may be used to provide the lowest possible k-value proximate to the transistor. As such, the drain breakdown voltage of the transistor may be maximized. Additionally, embodiments of the invention include dedicated field plates that are not formed as a bulk conductive structure with the gate electrode. As such, less metal is needed to form the field plates, and the parasitic capacitances that are associated with each field plate are reduced compared to currently available technologies. Furthermore, embodiments of the invention are able to form a plurality of field plate configurations that are not achievable in present state-of-the-art field plates for further optimization of breakdown voltage and parasitic capacitances. Specifically, embodiments of the invention allow for the field plates to be formed in any desired pattern. Additionally, the field plates may be maintained at any desired bias voltage (e.g., the field plates may be maintained at the gate voltage, or they may be maintained at one or more different voltages). To accomplish this, the field plates may be electrically coupled to the gate electrodes 115 and/or source electrodes 162.

Figure 2A:
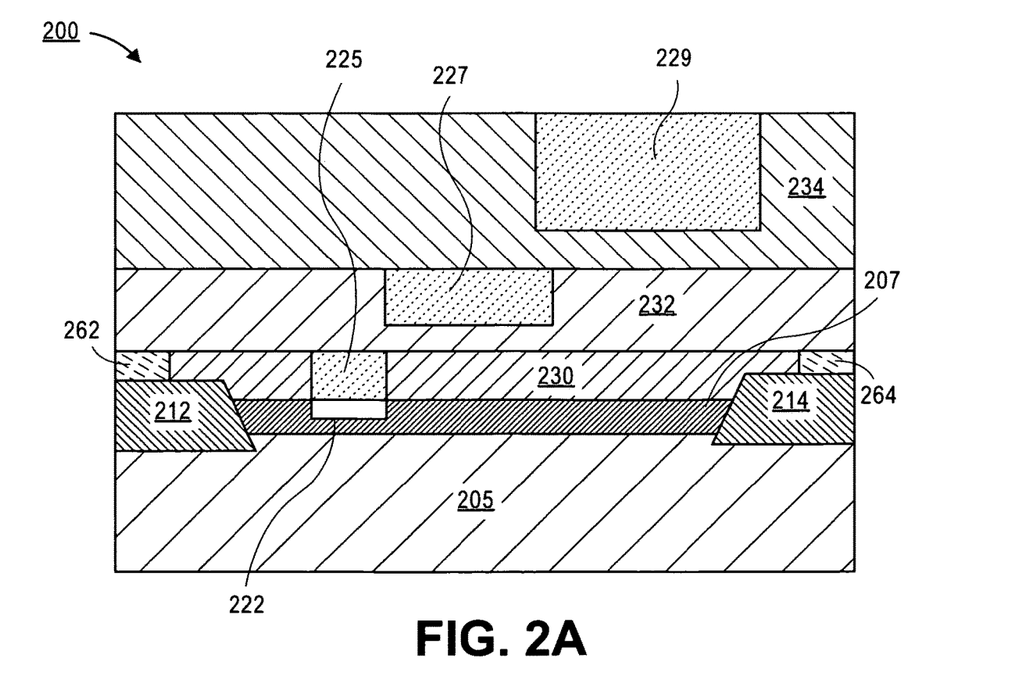
FIG. 2A is a cross-sectional illustration of a transistor that includes a plurality of field plates, according to an embodiment of the invention.

Referring now to FIG. 2A, a cross-sectional illustration of a transistor 200 is shown according to an embodiment of the invention. According to an embodiment, the transistor 200 may include a channel 205, source 212, and drain 214. In some transistors, a polarization charge inducing layer 207 may also be formed over the top surface of the channel 205. The gate electrode 125 is separated from the polarization layer and the channel 205 by a gate dielectric 222. A source electrode 262 may be electrically coupled with the source 212, and a drain electrode 264 may be electrically coupled to the drain 214.

Implementations of the invention may be formed or carried out on a substrate, such as a semiconductor substrate. In one implementation, the semiconductor substrate may be a crystalline substrate formed using a bulk semiconductor or a semiconductor-on-insulator substructure. In one particular embodiment, the semiconductor substrate may include a stack of semiconductor materials. For example, the semiconductor substrate may include a silicon base layer and one or more III-V semiconductor materials grown over the silicon base layer. In one example, a GaN layer may be the active device layer and may be separated from the silicon base layer by one or more buffer layers. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

While a single transistor 200 is illustrated in FIG. 2A, embodiments of the invention include forming a plurality of transistors, such as metal-oxide-semiconductor field-effect transistors (MOSFET or simply MOS transistors) on the substrate. Each MOS transistor includes a gate stack formed of at least two layers, a gate dielectric layer 222 and a gate electrode layer 225. The gate dielectric layer 222 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer 222 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode 225 may be formed on the gate dielectric layer 222 and may consist of at least one P-type workfunction metal or N-type workfunction metal, depending on whether the transistor is to be a PMOS or an NMOS transistor. In some implementations, the gate electrode 225 may consist of a stack of two or more metal layers, where one or more metal layers are workfunction metal layers and at least one metal layer is a fill metal layer.

For a PMOS transistor, metals that may be used for the gate electrode 225 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode 225 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

As is well known in the art, source regions 212 and drain regions 214 are formed within the substrate on opposite ends of the gate electrode 225 of each MOS transistor 200. The source and drain regions 212/214 are generally formed using either an implantation/diffusion process or an etching/deposition process. In the former process, dopants such as silicon (for forming N-type GaN devices) or magnesium (for forming P-type GaN devices) may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions 212/214. An epitaxial deposition process may then be carried out to fill the recesses with material that is used to fabricate the source and drain regions 212/214. In some embodiments, the epitaxially deposited source and drain regions 212/214 may be doped in situ with dopants. In further embodiments, the source and drain regions 212/214 may be formed using a semiconductor material that is different than the semiconductor material used in the active layer of transistor channel.

According to an embodiment of the invention, a polarization charge inducing layer 207 may be formed over the top surface of the channel 205. For example, when the channel 205 is GaN, the polarization layer 207 may be AlGaN.

One or more interlayer dielectrics (ILD) are deposited over the MOS transistors. In the illustrated embodiment, three ILD layers 230, 232, and 234 are shown. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. According to an embodiment, the ILD layers 230, 232, 234 may be different materials. Furthermore, it is to be appreciated that the processing operations (described in greater detail below) used to form the field plates allow for any material to be used for the ILD layers since there are no cavities formed below the field plates, as is the case in currently available field plate designs. Instead, embodiments of the invention include forming the ILD layer first and then using a damascene process to pattern the ILD layer and then fill the pattern with a conductive material to form the field plates.

According to an embodiment of the invention, the transistor 200 may include one or more field plates. In the illustrated embodiment, a first field plate 227 and a second field plate 229 are shown, though more or fewer field plates may be used according to embodiments of the invention. Embodiments of the invention may include forming each field plate in a different ILD. For example, the first field plate 227 is formed in the second ILD 232 and the second field plate 229 is formed in the third ILD 234. According to an embodiment, each of the field plates 227/229 may be formed during the same processing operation used to form the interconnect lines of the BEOL stack (as will be described in greater detail below). As such, embodiments of the invention may include field plates 227/229 that are formed with the same material used to form the interconnect lines and vias in the BEOL stack.

It is to be appreciated that the field plates 227 are a distinct component from the interconnect lines used in the BEOL stack. For example, the field plates 227/229 are floating (i.e., not connected to a circuit), whereas interconnect lines are connected in a circuit. Furthermore, the field plates 227/229 are different components than gate interconnects because they are formed over the channel region of the device and gate interconnects are typically formed along the edges of the transistor.

In the cross-sectional illustration the field plates 227/229 are not shown as being electrically coupled to each other. As such, each of the field plates 227/229 may be held at different bias voltages. The ability to hold field plates at different biases allows for further customization of the transistor that is not possible with currently available field plate designs since each field plate surface is coupled to the gate electrode. While the illustrated embodiment shows no interconnects between the plates, embodiments of the invention are not limited to such configurations. For example, one or more vias may be formed between the first and second field plates 227/229 in order to maintain a single bias voltage for both field plates. Additional embodiments may include one or more vias that electrically couple the field plates to the gate electrode 225 as well. However, it is to be appreciated that field plates 227/229 that are electrically coupled to each other and/or the gate electrode 225 by one or more vias are not considered to be a bulk conductive structure. Whereas a bulk conductive structure would include a substantially monolithic structure, embodiments of the invention include distinct conductive features (e.g., a gate electrode and one or more field plates) that are only electrically coupled by vias or, in some embodiments, not electrically coupled to each other at all.

Electrically coupling the field plates 227/229 and the gate electrode 225 with vias allows for a reduction in the amount of metal formed over the transistor, and reduces the parasitic capacitance compared to previous field plate designs. As such, the maximum operating frequency of transistor formed according to embodiments of the invention is greater than would be possible when the field plates are formed as a single bulk device.

In one embodiment, the field plates are formed in a tiled pattern. For example, the first field plate 227 and the second field plate 229 do not substantially overlap each other. While the field plates 227/229 are illustrated as not substantially overlapping each other, embodiments of the invention are not limited to such configurations. For example, the field plates may overlap each other and/or overlap the gate electrode 225. In addition to the field plate configuration illustrated in FIG. 2A, any desired arrangement of the field plates may be used, depending on the needs of the device. Some additional exemplary configurations are illustrated and described with respect to FIGS. 2B and 2C.

Figure 2B:
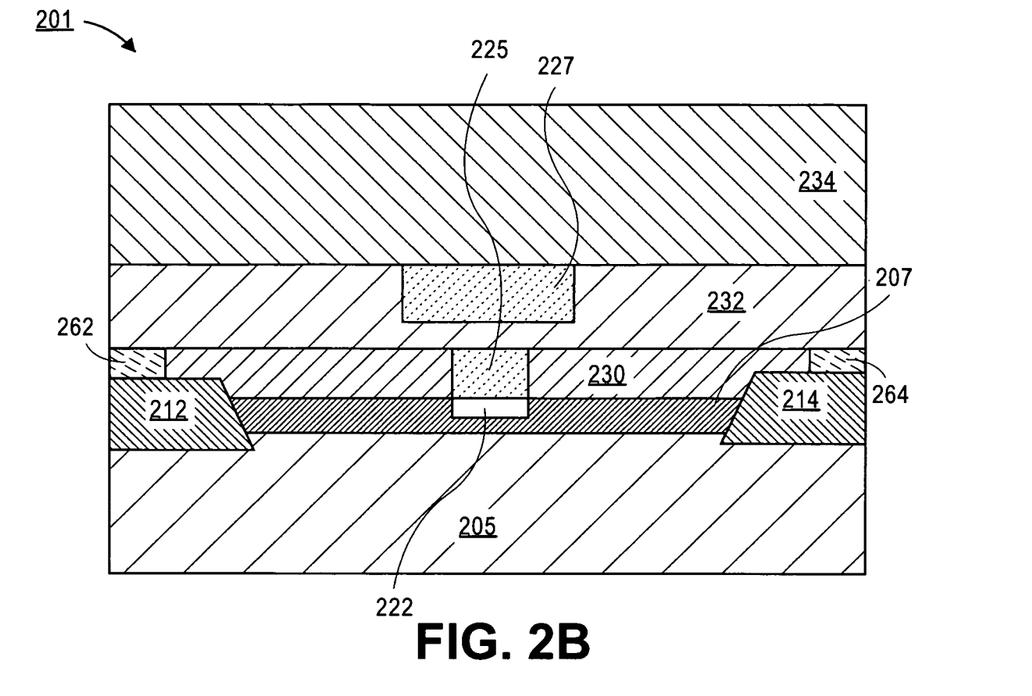
FIG. 2B is a cross-sectional illustration of a transistor that includes a single field plate, according to an embodiment of the invention.

Referring now to FIG. 2B, a cross-sectional illustration of a transistor 201 that includes a single field plate 227 is shown according to an embodiment of the invention. As illustrated, a single field plate 227 is formed in the second ILD 232. The field plate 227 spans substantially along the length of the channel 205 and passes above the top surface of the gate electrode 225. Such a configuration demonstrates that the width of the field plate 227 may be any desirable width. Additionally, the illustrated embodiment shows that the field plate 227 is centered over the gate electrode 225. However, embodiments are not limited to such configurations. For example, the field plate 227 may be offset towards either side of the transistor 201, depending on the needs of the device.

Figure 2C:
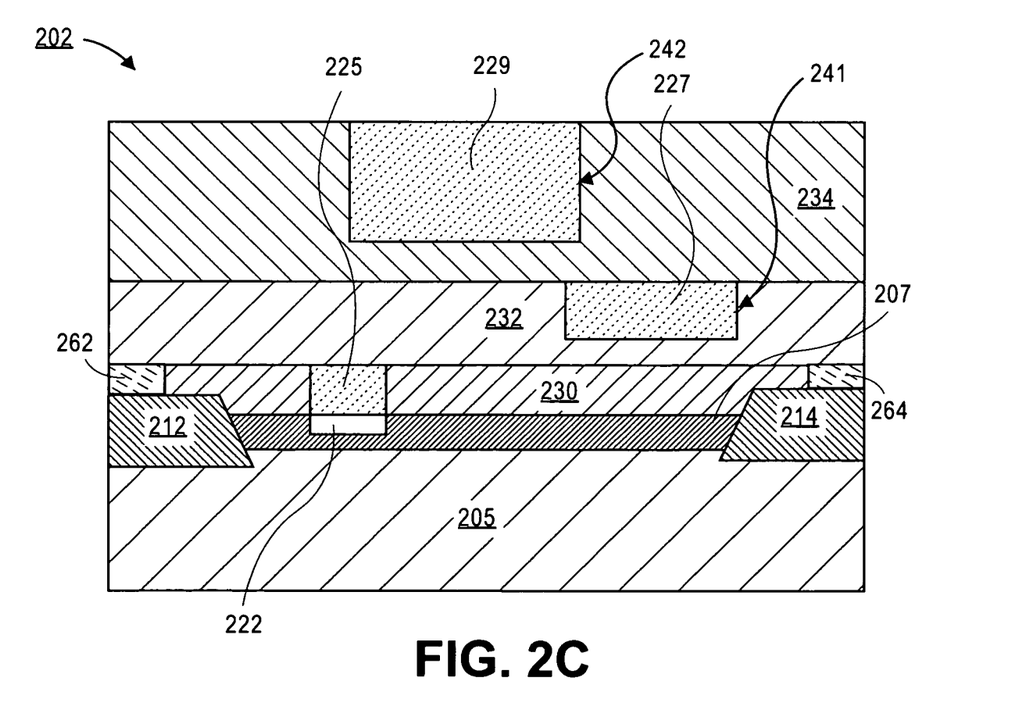
FIG. 2C is a cross-sectional illustration of a transistor that includes a plurality of field plates, according to an additional embodiment of the invention.

Referring now to FIG. 2C, a cross-sectional illustration of a transistor 202 with a first field plate 227 and a second field plate 229 is shown according to an embodiment of the invention. According to an embodiment of the invention, the outermost edge 242 of the second field plate 229 may be closer to a centerline of the gate electrode 225 than an outermost edge 241 of the first field plate 227. Accordingly, it is to be appreciated that embodiments of the invention allow for any desired configuration of the field plates in order to meet the specific needs of a device. In currently available field plate configurations formed with a single bulk conductive structure, the portion of the field plate with an outermost edge furthest from the gate electrode must be the uppermost field plate. However, embodiments of the present invention allow for each field plate to be formed at any desired location. It is to be appreciated that the flexibility in the positioning of the field plates is made possible due to the damascene patterning used in the BEOL processing. The flexibility in the positioning of the field plates is described in greater detail with respect to the process flow used to form the field plates illustrated and described with respect to FIGS. 3A-3H.

Figure 3A:
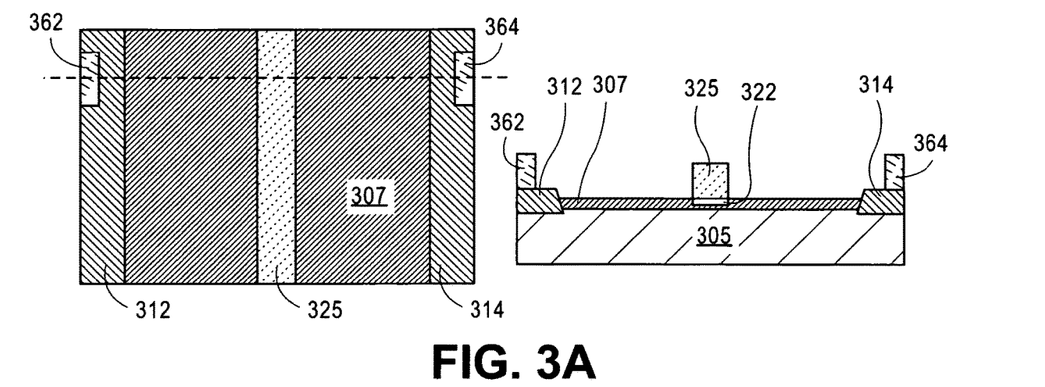
FIG. 3A is a cross-sectional illustration of a portion of a transistor, according to an embodiment of the invention.

Referring now to FIG. 3A, a plan view and corresponding cross-sectional view of a transistor is shown according to an embodiment of the invention. At this point in the processing, the source regions 312, drain regions 314, gate dielectric 322, gate electrode 325, and polarizing charge inducing layer 307 have been formed over the channel 305. These components may be formed with any suitable processing operations that are known in the art.

Figure 3B:
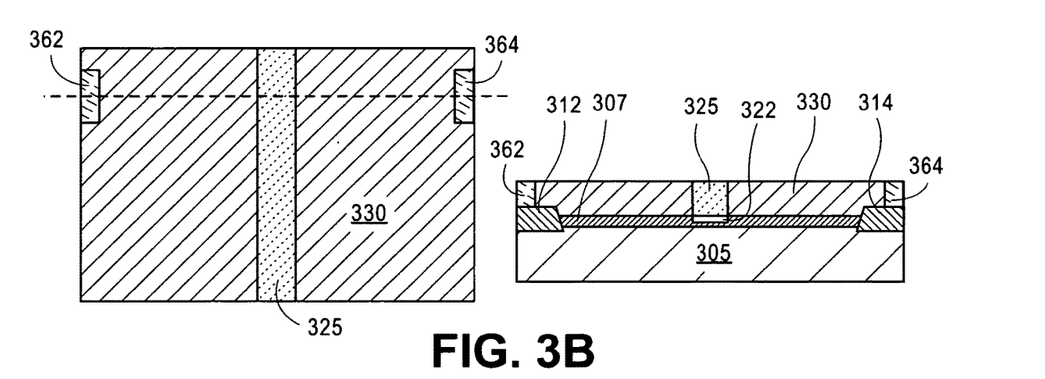
FIG. 3B is a cross-sectional illustration of the transistor in FIG. 3A after a first interlayer dielectric (ILD) is formed over the device, according to an embodiment of the invention.

Referring now to FIG. 3B, a plan view and corresponding cross-sectional view of a first ILD 330 deposited over the exposed surfaces is shown according to an embodiment of the invention. In the illustrated embodiment, the first ILD 330 may be formed so that is substantially coplanar with a top surface of the gate electrode 325. However, embodiments of the invention are not limited to such configurations, and the first ILD 330 may have a top surface that is above or below the top surface of the gate electrode 325.

According to an embodiment, the first ILD 330 may have the lowest k-value of any subsequently deposited ILDs. This allows for improved performance of the transistor due to a reduction in parasitic capacitance. Furthermore, it is to be appreciated that the material used to form the first ILD 330 is not limited by deposition techniques. In contrast to currently available field plate designs, there is no cavity formed by a bulk field plate structure that needs to be filled. As such, embodiments of the invention may include depositing the first ILD 330 with any needed process (e.g., sputtering, CVD, or the like).

Figure 3C:
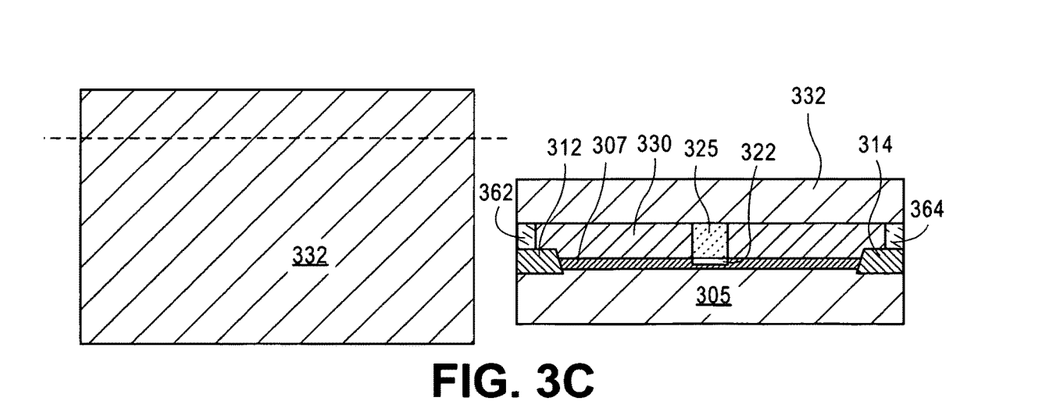
FIG. 3C is a plan view and corresponding cross-sectional illustration of the transistor in FIG. 3B after a second ILD is formed over the first ILD, according to an embodiment of the invention.

Referring now to FIG. 3C, a plan view and a corresponding cross-sectional view of a second ILD 332 deposited over the first ILD 330 is shown according to an embodiment of the invention. In an embodiment, the second ILD 332 may be any dielectric material. In some embodiments, the second ILD 332 may be the same dielectric material as the first ILD 330. Alternatively, the second ILD 332 may be a different material than the first ILD 330. For example, the second ILD 332 may be a material that has a higher k-value than the k-value of the first ILD 330. Since the second ILD 332 is further form the channel, a higher k-value may be a beneficial trade off if the second ILD 332 is less expensive or may be deposited faster than the first ILD 330. Accordingly, embodiments of the invention allow for increased flexibility in the material choices used to form the transistor compared to other field plate configurations.

Figure 3D:
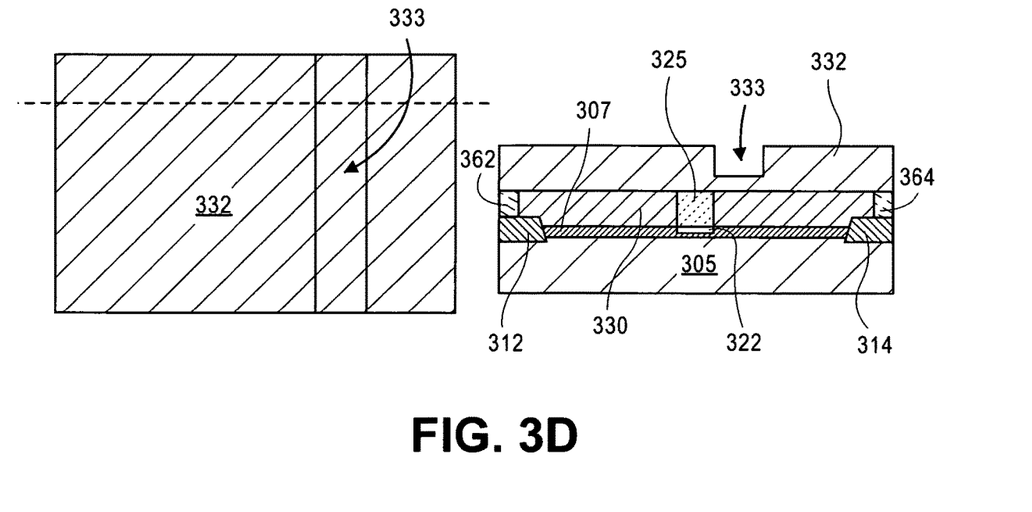
FIG. 3D is a plan view and corresponding cross-sectional illustration of the transistor in FIG. 3C after a first field plate trench is formed in the second ILD, according to an embodiment of the invention.

Referring now to FIG. 3D, a plan view and corresponding cross-sectional view of the second ILD 332 after a first field plate trench 333 is formed is shown according to an embodiment of the invention. In an embodiment, the first field plate trench 333 may be formed at the same time interconnect line trenches (not shown) are formed in the second ILD 332. As such, there is no additional masking or etching processes needed. For example, a preexisting mask layer used to pattern interconnect lines may be modified to include openings for forming the first field plate opening 333.

Figure 3E:
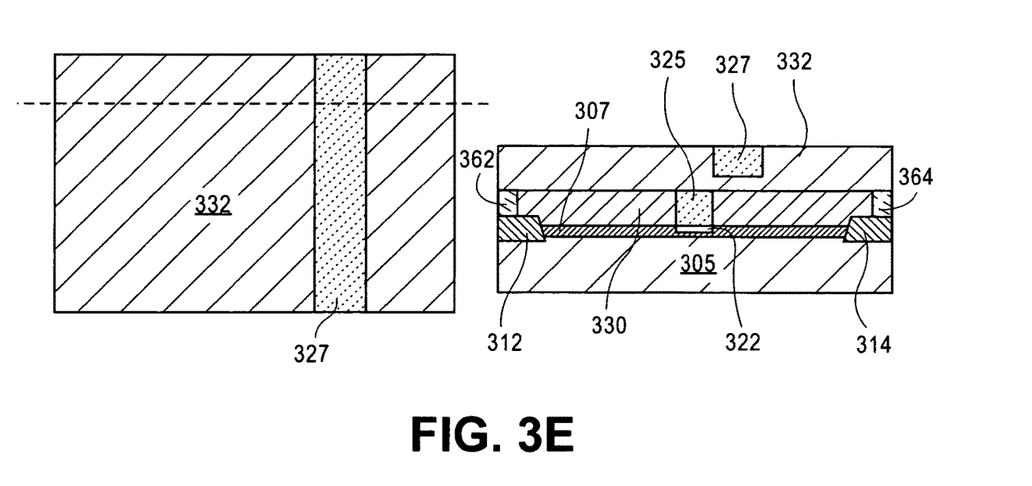
FIG. 3E is a plan view and corresponding cross-sectional illustration of the transistor in FIG. 3D after a first field plate is formed in the first field plate trench, according to an embodiment of the invention.

Referring now to FIG. 3E, a plan view and corresponding cross-sectional view of the second ILD 332 after a first field plate 327 is formed in the first field plate opening is shown according to an embodiment of the invention. For example, the first field plate 327 may be any suitable conductive material. In one embodiment, the first field plate 327 may be formed with the same metal used to form the gate electrode 325. Additional embodiments include forming the first field plate 327 with a different conductive material than the gate electrode 325. For example, the first field plate 327 may be the same material used to form the interconnect lines in the BEOL stack. In such an embodiment, a single metal deposition process may be used to form the interconnect lines (not shown) and the first field plate 327 in the second ILD layer 332.

Figure 3F:
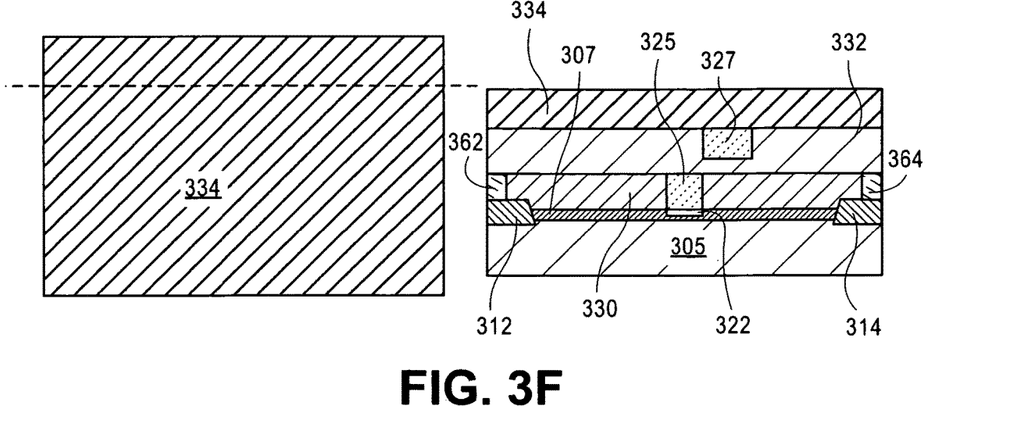
FIG. 3F is a plan view and corresponding cross-sectional illustration of the transistor in FIG. 3E after a third ILD is formed over the second ILD, according to an embodiment of the invention.

Referring now to FIG. 3F, a plan view and corresponding cross-sectional view of a third ILD 334 formed over the surface of the second ILD 332 and the first field plate 327 is shown according to an embodiment of the invention. In an embodiment, the third ILD 334 may be any dielectric material. In some embodiments, the third ILD 334 may be the same dielectric material as the first ILD 330 and/or the second ILD 332. Alternatively, the third ILD 334 may be a different material than the first ILD 330 and/or the second ILD 332. For example, the third ILD 334 may be a material that has a higher k-value than the k-value of the first ILD 330 and/or second ILD 332. Since the third ILD 334 is further form the channel, a higher k-value may be a beneficial trade off if the third ILD 334 is less expensive or may be deposited faster than the previously formed ILDs. Accordingly, embodiments of the invention allow for increased flexibility in the material choices used to form the transistor that other field plate configurations.

Figure 3G:
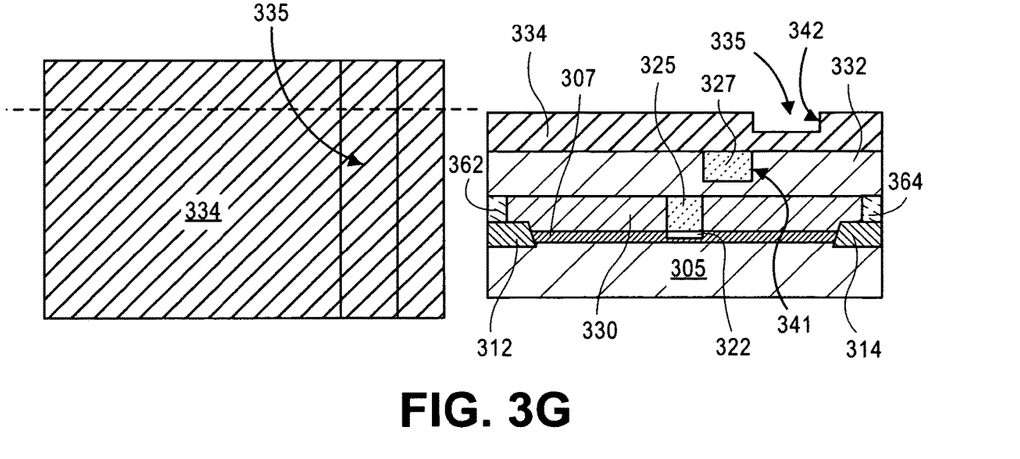
FIG. 3G is a plan view and corresponding cross-sectional illustration of the transistor in FIG. 3F after a second field plate trench is formed in the third ILD, according to an embodiment of the invention.

Referring now to FIG. 3G, a plan view and corresponding cross-sectional view of the third ILD 334 after a second field plate trench 335 is formed is shown according to an embodiment of the invention. In an embodiment, the second field plate trench 335 may be formed at the same time interconnect line trenches (not shown) are formed in the third ILD 334. As such, there is no additional masking or etching processes needed. For example, a preexisting mask layer used to pattern interconnect lines may be modified to include openings for forming the second field plate opening 335.

Additionally, since the patterning used to form the second field plate opening 335 is not dependent on the patterning for the first field plate opening 333, the second field plate opening 335 may be positioned at any location above the transistor. For example, the second field plate opening 335 may be positioned so that there is no overlap on the first field plate 327. This would be impossible with previous field plate designs that require a single bulk conductive material. Additionally, the second field plate opening 335 may be positioned so that an outermost edge 342 is positioned further from the centerline of the gate electrode 325 than the outermost edge 341 of the first field plate 327. In an additional embodiment not illustrated in FIG. 3G, the second field plate opening 335 may be formed so that an outermost edge 342 is positioned closer to the centerline of the gate electrode 325 than the outermost edge 341 of the first field plate 327. Such a configuration may be used to form a device similar to the one illustrated in FIG. 2C.

Figure 3H:
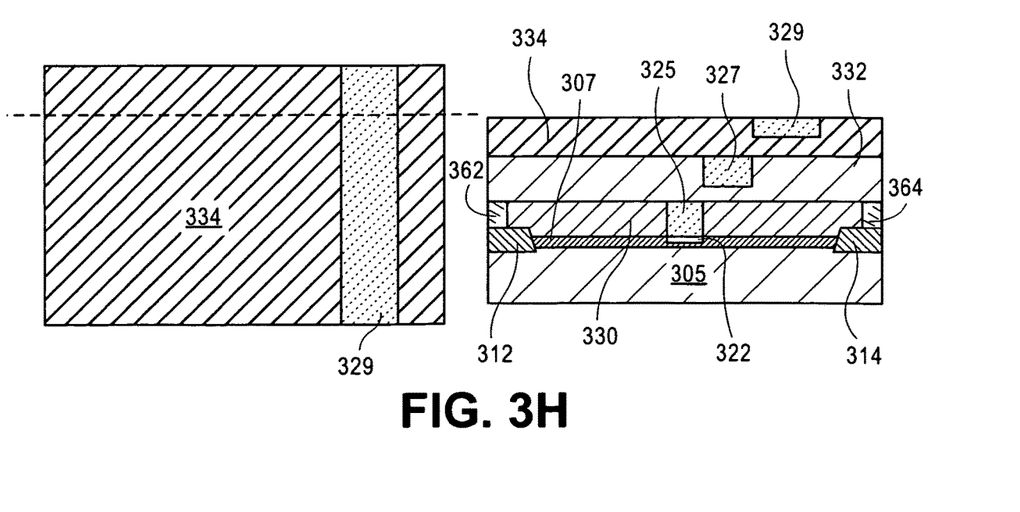
FIG. 3H is a plan view and corresponding cross-sectional illustration of the transistor in FIG. 3G after a second field plate is formed in the second field plate trench, according to an embodiment of the invention.

Referring now to FIG. 3H, a plan view and corresponding cross-sectional view of the third ILD 334 after a second field plate 329 is formed in the second field plate opening is shown according to an embodiment of the invention. For example, the second field plate 329 may be any suitable conductive material. In one embodiment, the second field plate 329 may be formed with the same metal used to form the gate electrode 325. Additional embodiments include forming the second field plate 329 with a different conductive material than the gate electrode 325. For example, the second field plate 329 may be the same material used to form the interconnect lines in the BEOL stack. In such an embodiment, a single metal deposition process may be used to form the interconnect lines (not shown) and the second field plate 329 in the third ILD layer 334.

While the process flow illustrated in FIGS. 3A-3H focus on the formation of the field plates, it is to be appreciated that one or more vias may be formed through one or more of the ILDs in order to provide electric connections to the field plates and the gate electrode. It is to be appreciated that the inclusion of vias does not add any extra processing operations since the vias will also need to be formed through the ILDs in order to form the vias between interconnect lines formed in the BEOL stack. In one embodiment, all of the field plates may be electrically coupled to the gate electrode by one or more vias formed through the ILDs. Additional embodiments include electrically coupling the field plates together with vias, but keeping the field plates at a different bias voltage than the gate electrode (i.e., the field plates are not coupled to the gate electrode with vias). In yet another embodiment, each of the field plates and gate electrode may be held at different bias voltages. For example a first field plate may be electrically coupled to the source electrode and the second field plate may be electrically coupled to the gate electrode. The flexibility in the positioning and bias voltage of each of the field plates allows for greater control in the manipulation of the drain electric field lines compared to currently available field plate designs.

Therefore, embodiments of the invention are able to take full advantage of the high breakdown voltage in GaN transistors because the drain electric field lines can be manipulated by placing and biasing the field plates so that the drain electric field lines do not concentrate at the edge of the gate and cause premature breakdown. Additionally, while embodiments of the invention indicate that this field plate configuration is particularly beneficial for use with high voltage devices, embodiments are not limited to such configurations. For example, the field plate configurations described herein may be used in conjunction with any semiconductor based transistor device.

Figure 4:
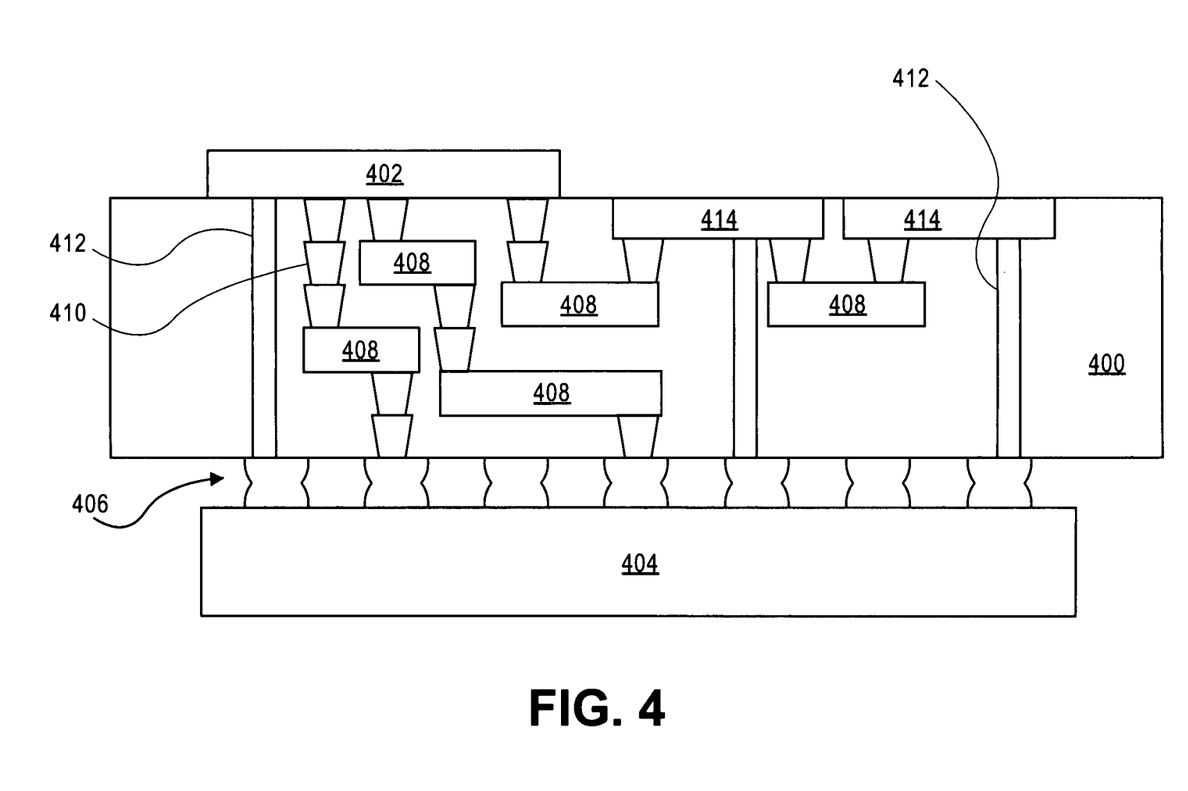
FIG. 4 is a cross-sectional illustration of an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses that include transistors with one or more field plates that are formed over the channel region, or processes for forming such devices disclosed herein may be used in the fabrication of interposer 400.

Figure 5:
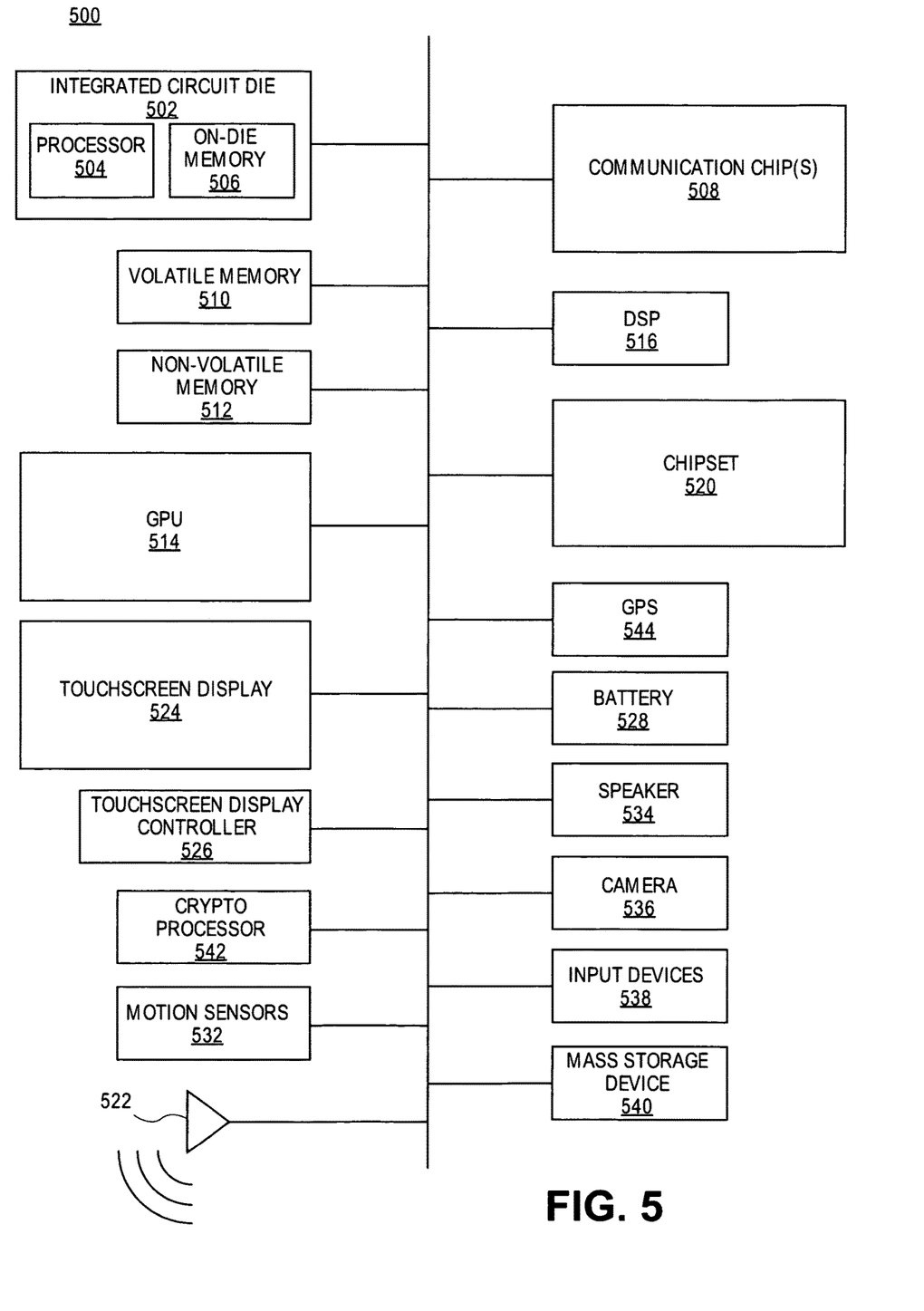
FIG. 5 is a schematic of a computing device that includes one or more transistors built in accordance with an embodiment of the invention.

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 544, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as transistors with one or more field plates that are formed over the channel region, according to an embodiment of the invention. The term "processor" may refer to any device or portion of a device that processes electronic data from registers and/or memory to transform that electronic data into other electronic data that may be stored in registers and/or memory.

The communication chip 508 may also include one or more devices, such as one or more transistors with one or more field plates that are formed over the channel region, according to an embodiment of the invention.

In further embodiments, another component housed within the computing device 500 may contain one or more devices, such as transistors that include one or more field plates that are formed over the channel region, or processes for forming such devices, according to an embodiment of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include a semiconductor device comprising: a semiconductor substrate having a source region, a drain region, and a gate electrode formed over a channel region formed between the source region and drain region; a first interlayer dielectric (ILD) formed over the channel region; a second ILD formed over the first ILD; and a first field plate formed in the second ILD, wherein the first field plate is not formed as a single bulk conductive feature with the gate electrode.

Additional embodiments of the invention include a semiconductor device, wherein the first field plate is coupled to the gate electrode or the source electrode with one or more vias.

Additional embodiments of the invention include a semiconductor device, wherein the first field plate is not electrically coupled to the gate electrode, and not electrically coupled to the source electrode.

Additional embodiments of the invention include a semiconductor device, wherein the first ILD is a different material than the second ILD.

Additional embodiments of the invention include a semiconductor device, further comprising: a third ILD; and a second field plate formed in the third ILD, wherein the second field plate is not formed as a single bulk conductive feature with the gate electrode or the first field plate.

Additional embodiments of the invention include a semiconductor device, wherein the first field plate and the second field plate do not substantially overlap each other.

Additional embodiments of the invention include a semiconductor device, wherein an outermost edge of the second field plate is closer to a centerline of the gate electrode than an outermost edge of the first field plate.

Additional embodiments of the invention include a semiconductor device, wherein the first field plate and the second field plate are electrically coupled together by one or more vias.

Additional embodiments of the invention include a semiconductor device, wherein the first field plate and the second field plate are electrically coupled to the gate electrode by one or more vias, or the first field plate and the second field plate are electrically coupled to the source electrode by one or more vias.

Additional embodiments of the invention include a semiconductor device, wherein the first field plate and the second field plate are the same material, and wherein the first field plate and the second field plate are a different material than the gate electrode.

Additional embodiments of the invention include a semiconductor device, wherein the first field plate and the second field plate are not electrically coupled together.

Additional embodiments of the invention include a semiconductor device, wherein one of the first field plate and the second field plate is electrically coupled to the gate electrode, and the other of the first field plate and the second field plate is electrically coupled to the source electrode.

Embodiments of the invention include a method of forming electric field plates over a transistor, comprising: forming a transistor that includes a source region, a drain region, a channel region between the source and drain region, and a gate electrode over the channel region; forming a first interlayer dielectric (ILD) over the channel region; forming a second ILD over the first ILD; patterning the second ILD to form a first field plate opening; depositing a conductive material into the first field plate opening to form a first field plate; forming a third ILD over the second ILD and the first field plate; patterning the third ILD to form a second field plate opening; and depositing a conductive material into the second field plate opening to form a second field plate.

Additional embodiments of the invention include a method of forming electric field plates over a transistor, wherein the first ILD is formed with a sputtering or chemical vapor deposition process.

Additional embodiments of the invention include a method of forming electric field plates over a transistor, wherein the first ILD is a different material than the second ILD.

Additional embodiments of the invention include a method of forming electric field plates over a transistor, wherein the first field plate opening is patterned at the same time one or more interconnect line openings are patterned in the second ILD, and wherein the first field plate is deposited at the same time the interconnect lines are formed in the second ILD.

Additional embodiments of the invention include a method of forming electric field plates over a transistor, wherein the second field plate opening is patterned at the same time one or more interconnect line openings are patterned in the third ILD, and wherein the second field plate is deposited at the same time the interconnect lines are formed in the third ILD.

Additional embodiments of the invention include a method of forming electric field plates over a transistor, wherein the gate electrode is a different material than the first field plate and the second field plate.

Additional embodiments of the invention include a method of forming electric field plates over a transistor, wherein the first field plate and the second field plate are not electrically coupled to the gate electrode, and not electrically coupled to the source electrode.

Additional embodiments of the invention include a method of forming electric field plates over a transistor, wherein the first field plate and the second field plate are electrically coupled by one or more vias.

Additional embodiments of the invention include a method of forming electric field plates over a transistor, wherein the first field plate and the second field plate are electrically coupled to the gate electrode or the source electrode by one or more vias.

Additional embodiments of the invention include a method of forming electric field plates over a transistor, wherein one of the first field plate and the second field plate is electrically coupled to the gate electrode, and the other of the first field plate and the second field plate is electrically coupled to the source electrode Additional embodiments of the invention include a method of forming electric field plates over a transistor, wherein the channel region is GaN.

Embodiments of the invention include a semiconductor device comprising: a semiconductor substrate having a source region, a drain region, and a gate electrode formed over a channel region formed between the source region and drain region, wherein the channel region is GaN, and wherein a polarization layer is formed over a top surface of the channel region; a first interlayer dielectric (ILD) formed over the channel region; a second ILD formed over the first ILD, wherein the first ILD has a lower k-value than the second ILD; a first field plate formed in the second ILD, wherein the first field plate is not formed as a single bulk conductive feature with the gate electrode; a third ILD; and a second field plate formed in the third ILD, wherein the second field plate is not formed as a single bulk conductive feature with the gate electrode or the first field plate.

Additional embodiments of the invention include a semiconductor device, wherein the first field plate and the second field plate are electrically coupled together by one or more vias.

What is claimed is:

1. A semiconductor device comprising:
a semiconductor substrate having a source region, a drain region, and a gate electrode formed over a channel region formed between the source region and drain region;
a first interlayer dielectric (ILD) formed over the channel region;
a second ILD formed over the first ILD; and
a first field plate formed in the second ILD, wherein the first field plate is not formed as a single bulk conductive feature with the gate electrode, and wherein a top surface of the first field plate is substantially coplanar with a top surface of the second ILD.

2. The semiconductor device of claim 1, wherein the first field plate is coupled to the gate electrode or the source electrode with one or more vias.

3. The semiconductor device of claim 1, wherein the first field plate is not electrically coupled to the gate electrode, and not electrically coupled to the source electrode.

4. The semiconductor device of claim 1, wherein the first ILD is a different material than the second ILD.

5. The semiconductor device of claim 1, further comprising:
a third ILD; and
a second field plate formed in the third ILD, wherein the second field plate is not formed as a single bulk conductive feature with the gate electrode or the first field plate.

6. The semiconductor device of claim 5, wherein the first field plate and the second field plate do not substantially overlap each other.

7. The semiconductor device of claim 5, wherein an outermost edge of the second field plate is closer to a centerline of the gate electrode than an outermost edge of the first field plate.

8. The semiconductor device of claim 5, wherein the first field plate and the second field plate are electrically coupled together by one or more vias.

9. The semiconductor device of claim 8, wherein the first field plate and the second field plate are electrically coupled to the gate electrode by one or more vias, or the first field plate and the second field plate are electrically coupled to the source electrode by one or more vias.

10. The semiconductor device of claim 5, wherein the first field plate and the second field plate are the same material, and wherein the first field plate and the second field plate are a different material than the gate electrode.

11. The semiconductor device of claim 5, wherein the first field plate and the second field plate are not electrically coupled together.

12. The semiconductor device of claim 11, wherein one of the first field plate and the second field plate is electrically coupled to the gate electrode, and the other of the first field plate and the second field plate is electrically coupled to the source electrode.

13. A method of forming electric field plates over a transistor, comprising:
forming a transistor that includes a source region, a drain region, a channel region between the source and drain region, and a gate electrode over the channel region;
forming a first interlayer dielectric (ILD) over the channel region;
forming a second ILD over the first ILD;
patterning the second ILD to form a first field plate opening;
depositing a conductive material into the first field plate opening to form a first field plate;
forming a third ILD over the second ILD and the first field plate;
patterning the third ILD to form a second field plate opening; and depositing a conductive material into the second field plate opening to form a second field plate.

14. The method of claim 13, wherein the first ILD is formed with a sputtering or chemical vapor deposition process.

15. The method of claim 13, wherein the first ILD is a different material than the second ILD.

16. The method of claim 13, wherein the first field plate opening is patterned at the same time one or more interconnect line openings are patterned in the second ILD, and wherein the first field plate is deposited at the same time the interconnect lines are formed in the second ILD.

17. The method of claim 16, wherein the second field plate opening is patterned at the same time one or more interconnect line openings are patterned in the third ILD, and wherein the second field plate is deposited at the same time the interconnect lines are formed in the third ILD.

18. The method of claim 13, wherein the gate electrode is a different material than the first field plate and the second field plate.

19. The method of claim 13, wherein the first field plate and the second field plate are not electrically coupled to the gate electrode, and not electrically coupled to the source electrode.

20. The method of claim 13, wherein the first field plate and the second field plate are electrically coupled by one or more vias.

21. The method of claim 20, wherein the first field plate and the second field plate are electrically coupled to the gate electrode or the source electrode by one or more vias.

22. The method of claim 13, wherein one of the first field plate and the second field plate is electrically coupled to the gate electrode, and the other of the first field plate and the second field plate is electrically coupled to the source electrode.

23. The method of claim 13, wherein the channel region is GaN.

24. A semiconductor device comprising:
    a semiconductor substrate having a source region, a drain region, and a gate electrode formed over a channel region formed between the source region and drain region, wherein the channel region is GaN, and wherein a polarization layer is formed over a top surface of the channel region;
    a first interlayer dielectric (ILD) formed over the channel region;
    a second ILD formed over the first ILD, wherein the first ILD has a lower k-value than the second ILD;
    a first field plate formed in the second ILD, wherein the first field plate is not formed as a single bulk conductive feature with the gate electrode;
    a third ILD; and
    a second field plate formed in the third ILD, wherein the second field plate is not formed as a single bulk conductive feature with the gate electrode or the first field plate.

25. The semiconductor device of claim 21, wherein the first field plate and the second field plate are electrically coupled together by one or more vias.

* * * * *